(12) United States Patent
Yang et al.

(10) Patent No.: US 6,495,469 B1
(45) Date of Patent: Dec. 17, 2002

(54) HIGH SELECTIVITY, LOW ETCH DEPTH MICRO-LOADING PROCESS FOR NON STOP LAYER DAMASCENE ETCH

(75) Inventors: Jiing-Feng Yang, Hualien (TW); Li-Te S. Lin, Hsin-Chu (TW); Li-Chih Chao, Tao-yuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/999,309

(22) Filed: Dec. 3, 2001

(51) Int. Cl.$^7$ ............................................. H01L 21/302
(52) U.S. Cl. ....................... 438/725; 438/714; 438/717; 438/724; 438/736; 438/687; 430/5
(58) Field of Search ................................. 438/725, 714, 438/717, 724, 736, 687, 624, 618, 637, 638, 639, 640; 430/5

(56) References Cited

U.S. PATENT DOCUMENTS

| | | | |
|---|---|---|---|
| 5,445,710 A | 8/1995 | Hori et al. ................ 156/643.1 |
| 5,843,847 A | 12/1998 | Pu et al. ...................... 438/723 |
| 5,930,677 A | 7/1999 | Zheng et al. ................ 438/782 |
| 6,087,266 A | 7/2000 | Abraham ..................... 438/714 |
| 6,114,259 A | * 9/2000 | Sukharev et al. ........... 438/789 |
| 6,211,092 B1 | 4/2001 | Tang et al. .................. 438/719 |
| 6,232,134 B1 | 5/2001 | Farber et al. ................... 438/9 |
| 6,294,457 B1 | * 9/2001 | Liu ............................. 438/623 |
| 6,376,366 B1 | * 4/2002 | Lin et al. ..................... 438/637 |

\* cited by examiner

*Primary Examiner*—George Goudreau
(74) *Attorney, Agent, or Firm*—George O. Saile; Stephen B. Ackerman; Stephen G. Stanton

(57) ABSTRACT

A method for etching a dielectric layer comprising the following steps. A structure having a low-k dielectric layer formed thereover is provided. A DARC layer is formed over the low-k dielectric layer. A patterned masking layer is formed over the DARC layer. Using the patterned masking layer as a mask, the DARC layer and the low-k dielectric layer are etched employing an $CH_xF_y/O_2/N_2/Ar$ etch chemistry.

36 Claims, 3 Drawing Sheets

HIGH SELECTIVITY, LOW ETCH DEPTH MICRO-LOADING PROCESS FOR NON STOP LAYER DAMASCENE ETCH

FIELD OF THE INVENTION

The present invention relates generally to semiconductor fabrication and more specifically to damascene etch methods.

BACKGROUND OF THE INVENTION

When simultaneously etching wide and relatively narrow trenches/vias, the microloading effect produces more etching in open areas (wide trenches/vias)than in narrow/dense areas. Thus, wider openings are generally etched deeper than narrow openings.

U.S. Pat. No. 6,211,092 B1 to Tang et al. describes a dual damascene etch process using a $CHF/O_2/Ar$ etch with anti-reflective coating (ARC) layers.

U.S. Pat. No. 5,843,847 to Pu et al. and U.S. Pat. No. 5,445,710 to Hori et al. each describe low-k material etches with CO/N/CHF and Ar etch chemistries.

U.S. Pat. No. 6,232,134 B1 to Farber et al. describes a method and apparatus for monitoring wafer characteristics and/or semiconductor processing consistency using wafer charge distribution measurements.

U.S. Pat. No. 6,087,266 to Abraham describes methods an apparatus for improving microloading while etching a substrate.

U.S. Pat. No. 5,930,677 to Zheng et al. describes a method for reducing microloading in an etchback of spin-on-glass or polymer.

SUMMARY OF THE INVENTION

Accordingly, it is an object of an embodiment of the present invention to provide an improved method of high selectivity, low etch depth micro-loading process for non middle stop layer damascene etching.

Other objects will appear hereinafter.

It has now been discovered that the above and other objects of the present invention may be accomplished in the following manner. Specifically, a structure having a low-k dielectric layer formed thereover is provided. A DARC layer is formed over the low-k dielectric layer. A patterned masking layer is formed over the DARC layer. Using the patterned masking layer as a mask, the DARC layer and the low-k dielectric layer are etched employing an $CH_xF_y/O_2/N_2/Ar$ etch chemistry.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Brief Summary of the Invention

Due to the non use of a middle stop layer, the damascene Rs will greatly impact the etch depth. Higher selectivity and better etch depth control for damascene etching for 0.1 μm technology and beyond are expected. The inventors have discovered that the way to improve selectivity is by using $CH_xF_y/N_2/Ar$ etch chemistry which will improve resist selectivity from about 0.87 to about 2.45. The inventors have further discovered that the way to gain better etch depth control for the non-stop layer damascene is adding $O_2$ to the $CH_xF_y/N_2/Ar$ etch chemistry which will reduce the large amount of polymer deposition on the wafer center. This improves the etch depth micro-loading from a 1600 Å (dense/wider openings) difference to less than about a 500 Å (base on 4500 Å etch depth) difference. The inventors have discovered that a polymer rich etch chemistry provides superior results versus a lean etch chemistry in improving resist selectivity while keeping depth micro-loading-free. This etch chemistry is specifically optimized for a non-stop layer low-k damascene etch and may be used during an inorganic dielectric anti-reflective coating (DARC) material open step as described below.

Initial Structure

Figure 1:
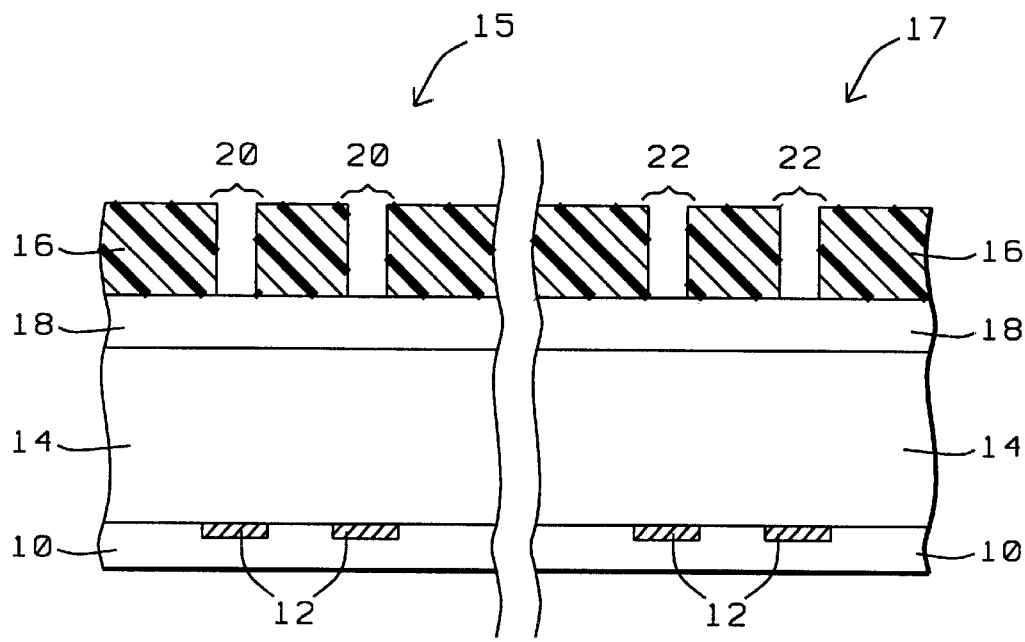
FIGS. 1 to 5 schematically illustrate a preferred embodiment of the present invention.

As shown in FIG. 1, structure 10 includes exposed metal structures 12. Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Structure 10 includes an open area 15 and a dense area 17 separated on structure 10 as indicated.

Exposed metal structures 12 may be metal lines or metal vias, for example, electrically connected to other devices within structure 10. Metal structures 12 are preferably comprised of copper (Cu), aluminum (Al), gold (Au), AlCu or W.

Intermetal dielectric (IMD) layer 14 is formed over structure 10 and the exposed metal structures 12 to a thickness of preferably from about 1200 to 10,000 Å and more preferably from about 5000 to 7500 Å. IMD layer 14 is preferably comprised of oxide, silicon oxide ($SiO_2$) or a low-k material and is more preferably $SiO_2$.

Dielectric anti-reflective coating (DARC) layer 18 may be formed over IMD layer 14 to a thickness of preferably from about 300 to 1200 Å and more preferably from about 500 to 700 Å. DARC layer 18 is preferably comprised of a low-k dielectric material such as nitride, silicon nitride (SiN), oxynitride, silicon oxynitride (SiON) or SiC.

A first patterned masking layer 16 is formed over DARC layer 18 and includes: via transfer openings 20 within the open area 15 and above at least a portion of the respective metal structures 12 within open area 15; and via transfer openings 22 within the dense area 17 and above at least a portion of the respective metal structures 12 within dense area 17. First patterned masking layer 16 is preferably photoresist such as 193 nm photoresist, 157 nm photoresist or even extreme ultraviolet (EUV) photoresist.

Etching of Initial Via Openings 30, 40

Figure 2:
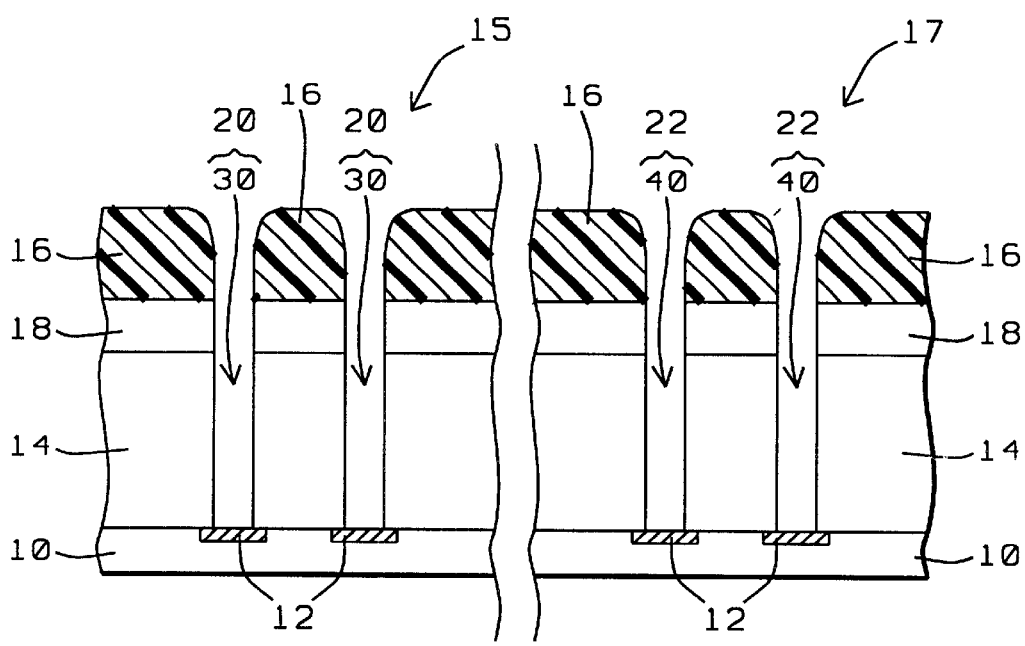

As shown in FIG. 2, using the first patterned masking layer 16 as a mask, DARC layer 18 and IMD layer 14 are etched, forming initial via openings 30, 40 in open area 15 and dense area 17, respectively. The initial via openings 30, 40 preferably expose at least a portion of the respective metal structures 12.

This DARC layer 18/IMD layer 14 initial via openings 39, 40 etch may employ, for example, preferably a $C_4F_8$ etch chemistry, a $C_5F_8$ etch chemistry, a $C_4F_6$ etch chemistry or a $CF_4$ etch chemistry and more preferably employs a $C_5F_8$ etch chemistry.

Removal of First Patterned Masking Layer 16

Figure 3:
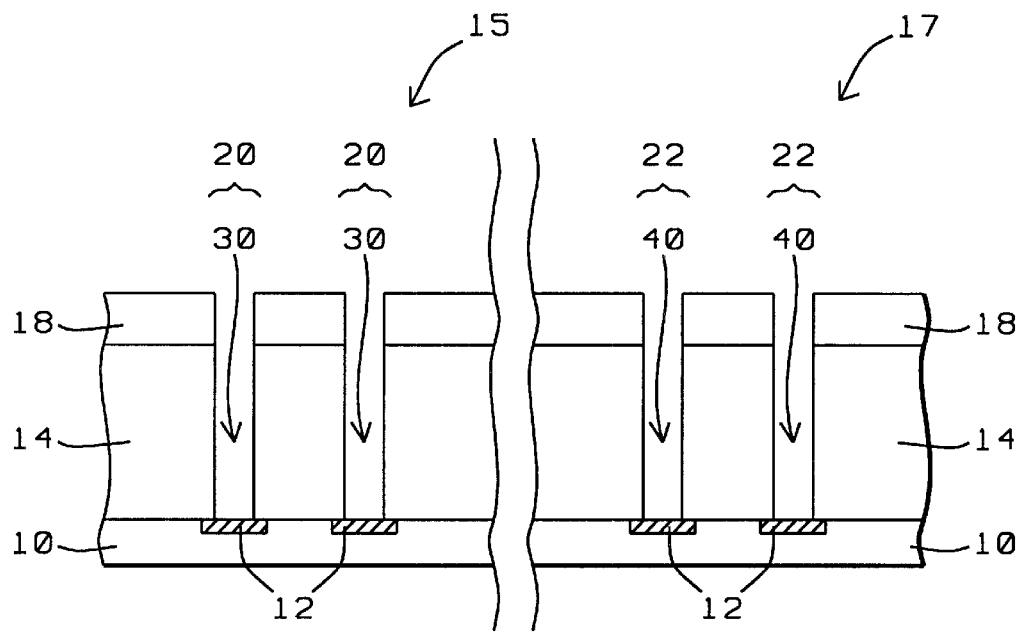

As shown in FIG. 3, the first patterned masking layer 16 is then removed. The structure may also then be cleaned.

Formation of Second Patterned Masking Layer 26

Figure 4:
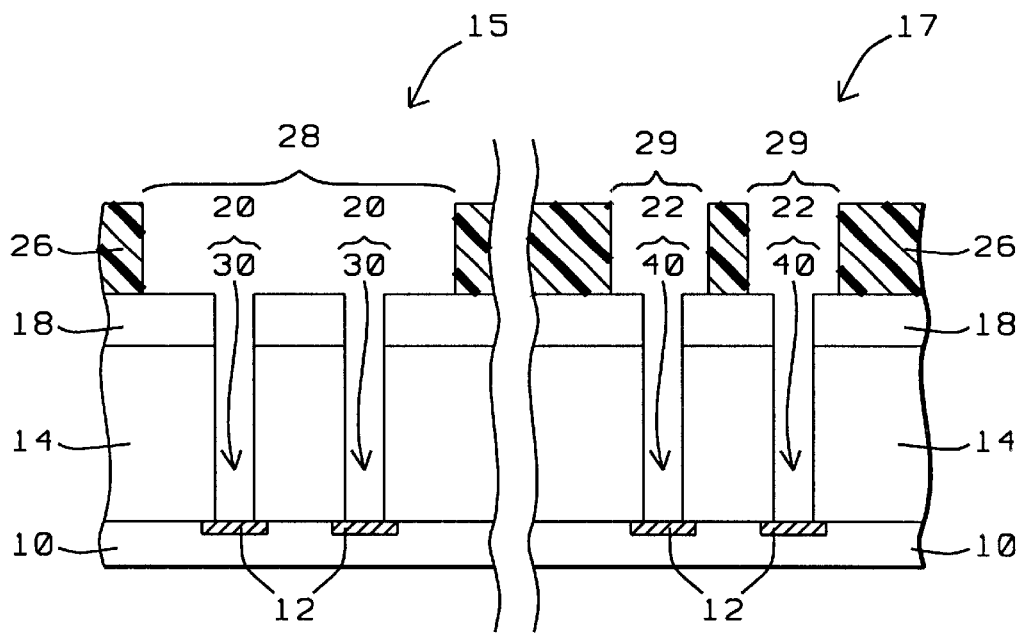

As shown in FIG. 4, a second patterned masking layer 26 is formed over etched DARC layer 18 and includes: a wide trench transfer opening 28 over the initial via openings 30 within the open area 15; and respective narrower trench transfer openings 29 roughly centered over each initial via opening 40 within the dense area 17.

Second patterned masking layer 26 is preferably photoresist.

Key Step of the Invention—Etching of Trench Openings 32, 42 with Polymer Rich Etch Chemistry In the key step of the invention, using the second patterned masking layer 26 as a mask, DARC layer 18 and IMD layer 14 are further etched using a novel polymer rich etch chemistry, forming: wide trench opening 32 within open area 15; and narrower trench openings 42 roughly centered over the respective initial via openings 40 within dense area 17. This forms: open dual damascene opening 34 comprising upper wide trench opening 32 and lower final via openings 30' within open area 15; and narrower dual damascene openings 44 each comprising an upper narrower trench opening 42 and a respective lower final via opening 40' within dense area 17.

Wide trench opening 32 has a width 50 of preferably greater than about 20,000 Å. Narrower trench openings 42 each have a width 60 of preferably less than about 5000 Å and more preferably less than about 2000 Å.

The novel rich etch chemistry of the present invention to open the DARC layer 18 comprises a $CH_xF_y/O_2/N_2/Ar$ micro-loading-free etch chemistry having a total etch depth range of preferably less than about 4500 Å+/−250 Å and more preferably less than about 4500 Å+/−150 Å.

The $CH_xF_y/O_2/N_2/Ar$ etch chemistry has an etch selectivity of preferably greater than about 2 and more preferably greater than about 2.5.

Figure 5:
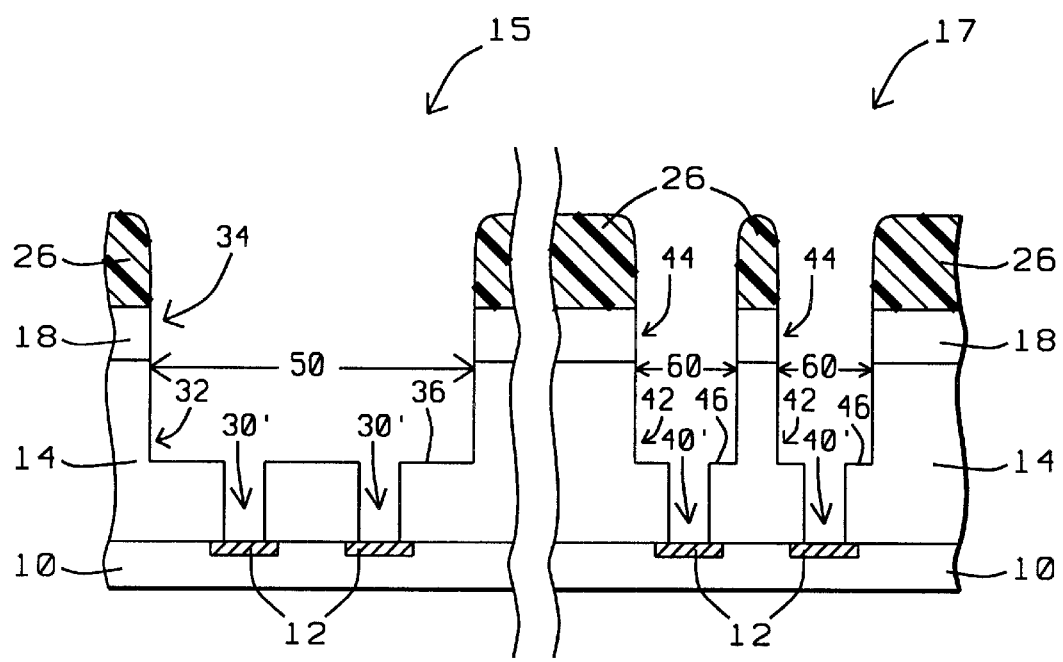

As shown in FIG. 5, the bottom 36 of wide trench opening 32 and the bottoms 46 of narrower trench openings 42 are essentially coplanar, i.e. the respective bottoms 36, 46 lie essentially in the same horizontal plane, demonstrating the micro-loading-free characteristic of the novel $CH_xF_y/O_2/N_2/Ar$ etch chemistry of the present invention. That is, despite the narrower width 60 of the narrower trench openings 42 as compared to the wider width 50 of the wide trench opening 32, a micro-loading effect (whereby etching of the narrower trench openings 42 would proceed more slowly than etching of the wide trench opening 32 and hence would be shallower than the wide trench opening) is avoided by the use of the novel $CH_xF_y/O_2/N_2/Ar$ etch chemistry of the present invention.

The $CH_xF_y/O_2/N_2/Ar$ etch chemistry of the present invention is conducted at the following parameters:

| I. Gas | Gas Flow Rate (sccm) |
|---|---|
| $CH_xF_y$ | from about 30 to 90 |
| $O_2$ | from about 4 to 15 |
| $N_2$ | from about 15 to 180 |
| Ar | from about 100 to 500; |

II. Low Electrode Temperature
   from about 0 to 60° C.; and;

III. Pressure
   from about 50 to 150 mTorr.

The $CH_xF_y$ is preferably $CH_3F$, $CH_2F_2$ or $CHF_3$.

Further processing may then proceed normally (not shown), for example: removing the second patterned masking layer 26; cleaning the structure; forming a seed metal layer formed of TaN or Cu, for example, within the open dual damascene opening 34 and the narrower dual damascene openings 44; depositing a metal layer within the seed metal lined dual damascene openings 34, 44 and planarizing, the metal layer by, for example, chemical mechanical polishing (CMP), to form planarized dual damascene metal structures within the open dual damascene opening 34 and the narrower dual damascene openings 44.

Advantages of the Present Invention

The advantages of one or more embodiments of the present invention include:

1. gain higher dielectric layer to photoresist selectivity; and 2. have lower depth microloading range which will reduce $R_s$ deviation.

While particular embodiments of the present invention have been illustrated and described, it is not intended to limit the invention, except as defined by the following claims.

We claim:

1. A method for etching a dielectric layer, comprising the steps of:

providing a structure having a low-k dielectric layer formed thereover;

forming a DARC layer over the low-k dielectric layer;

forming a patterned masking layer over the DARC layer; and using the patterned masking layer as a mask, etching the DARC layer and the low-k dielectric layer employing an $CH_xF_y/O_2/N_2/Ar$ etch chemistry.

2. The method of claim 1, wherein the $CH_xF_y/O_2/N_2/Ar$ etch chemistry is employed at the following conditions:

$CH_xF_y$ gas at from about 30 to 90 sccm;

$O_2$ gas at from about 4 to 15 sccm;

$N_2$ gas at from about 15 to 180 sccm;

Ar gas at from about 100 to 500 sccm;

a low electrode temperature of from about 0 to 60° C.; and a pressure of from about 50 to 150 mTorr.

3. The method of claim 1, wherein the $CH_xF_y/O_2/N_2/Ar$ etch chemistry has an etch depth micro-loading of less than about 4500 Å+/−250 Å.

4. The method of claim 1, wherein the $CH_xF_y/O_2/N_2/Ar$ etch chemistry has an etch depth micro-loading of less than about 4500 Å+/−150 Å.

5. The method of claim 1, wherein the $CH_xF_y/O_2/N_2/Ar$ etch chemistry has an etch selectivity of greater than about 2.

6. The method of claim 1, wherein the $CH_xF_y/O_2/N_2/Ar$ etch chemistry has an etch selectivity of greater than about 2.5.

7. The method of claim 1, wherein the $CH_xF_y/O_2/N_2/Ar$ etch chemistry has an etch depth micro-loading of less than about 4500 Å+/−250 Å and an etch selectivity of greater than about 2.

8. The method of claim 1, wherein the $CH_xF_y/O_2/N_2/Ar$ etch chemistry has an etch depth micro-loading of less than about 4500 Å+/−250 Å and an etch selectivity of greater than about 2.5.

9. The method of claim 1, wherein $CH_xF_y$ is selected from the group consisting of $CH_3F$, $CH_2F_2$ and $CHF_3$.

10. A method for etching a dielectric layer, comprising the steps of:
  providing a structure having a low-k dielectric layer formed thereover;
  forming a DARC layer over the low-k dielectric layer;
  forming a patterned masking layer over the DARC layer;
  using the patterned masking layer as a mask, etching the DARC layer and the low-k dielectric layer employing an $CH_xF_y/O_2/N_2/Ar$ etch chemistry, having an etch depth micro-loading of less than about 500 Å with a base on 4500 Å etch depth, at the following conditions:
    $CH_xF_y$ gas at from about 30 to 90 sccm;
    $O_2$ gas at from about 4 to 15 sccm;
    $N_2$ gas at from about 15 to 180 sccm;
    Ar gas at from about 100 to 500 sccm;
    a low electrode temperature of from about 0 to 60° C.; and
    a pressure of from about 50 to 150 mTorr;
  wherein the $CH_xF_y/O_2/N_2/Ar$ etch chemistry has an etch selectivity of greater than about 2.

11. The method of claim 10, wherein the $CH_xF_y/O_2/N_2/Ar$ etch chemistry has an etch selectivity of greater than about 2.5.

12. The method of claim 10, wherein $CH_xF_y$ is selected from the group consisting of $CH_3F$, $CH_2F_2$ and $CHF_3$.

13. A method for etching dual damascene openings, comprising the steps of:
  providing a structure having an open area and a dense area; the structure having exposed metal structures formed therein within the open area and the dense area;
  forming an low-k dielectric layer over the structure and the exposed metal structures;
  forming a DARC layer over the low-k dielectric layer;
  forming a first patterned masking layer over the DARC layer; the first patterned masking layer having:
    via transfer openings exposing a portion of the DARC layer within the open area over at least a portion of the respective exposed metal structures within the open area; and
    via transfer openings exposing a portion of the DARC layer within the dense area over at least a portion of the respective exposed metal structures within the dense area;
  using the first patterned masking layer as a mask, etching the DARC layer and the low-k dielectric layer within the open area and the dense area, forming initial via openings exposing the respective exposed metal structures within the open area and the dense area;
  removing the first patterned masking layer;
  forming a second patterned masking layer over the etched DARC layer; the second patterned masking layer having:
    a wide trench transfer opening within the open area and over the initial via openings within the open area; and
    respective narrow trench transfer openings over the initial via openings within the dense area; and
  using the second patterned masking layer as a mask, further etching the DARC layer and the low-k dielectric layer employing an $CH_xF_y/O_2/N_2/Ar$ etch chemistry to form:
    a trench opening within the low-k dielectric layer within the open area; the open area trench opening having a bottom; the open area trench opening and the remaining open area initial via openings comprising an open area dual damascene opening; and
    trench openings within the low-k dielectric layer within the dense area; each dense area trench opening having a bottom; the dense area trench openings with their respective remaining dense area initial via openings comprising respective dense area dual damascene openings; the dense area trench openings being narrower than the open area trench opening.

14. The method of claim 13, wherein the $CH_xF_y/O_2/N_2/Ar$ etch chemistry is employed at the following conditions:
  $CH_xF_y$ gas at from about 30 to 90 sccm;
  $O_2$ gas at from about 4 to 15 sccm;
  $N_2$ gas at from about 15 to 180 sccm;
  Ar gas at from about 100 to 500 sccm;
  a low electrode temperature of from about 0 to 60° C.; and
  a pressure of from about 50 to 150 mTorr.

15. The method of claim 13, wherein the $CH_xF_y/O_2/N_2/Ar$ etch chemistry has an etch depth micro-loading of less than about 4500 Å+/−250 Å.

16. The method of claim 13, wherein the $CH_xF_y/O_2/N_2/Ar$ etch chemistry has an etch depth micro-loading of less than about 4500 Å+/−150 Å.

17. The method of claim 13, wherein the $CH_xF_y/O_2/N_2/Ar$ etch chemistry has an etch selectivity of greater than about 2.

18. The method of claim 13, wherein the $CH_xF_y/O_2/Ar$ etch chemistry has an etch selectivity of greater than about 2.5.

19. The method of claim 13, wherein the $CH_xF_y/O_2/N_2/Ar$ etch chemistry has an etch depth micro-loading of less than about 4500 Å+/−250 Å and an etch selectivity of greater than about 2.

20. The method of claim 13, wherein the $CH_xF_y/O_2/N_2/Ar$ etch chemistry has an etch depth micro-loading of less than about 4500 Å+/−250 Å and an etch selectivity of greater about 2.5.

21. The method of claim 13, wherein $CH_xF_y$ is selected from the group consisting of $CH_3F$, $CH_2F_2$ and $CHF_3$.

22. The method of claim 13, wherein the low-k dielectric layer is formed to a thickness of from about 1200 to 10,000 Å; and the DARC layer is formed to a thickness of from about 300 to 1200 Å.

23. The method of claim 13, wherein the low-k dielectric layer is formed to a thickness of from about 5000 to 7500 Å; and the DARC layer is formed to a thickness of from about 500 to 700 Å.

24. The method of claim 13, wherein the open area trench opening is greater than about 20,000 Å wide and the dense area trench openings each have a width of less than about 5000 Å.

25. The method of claim 13, wherein the open area trench opening is greater than about 20,000 Å wide and the dense area trench openings each have a width of less than about 2000 Å.

26. The method of claim 13, wherein the low-k dielectric layer is comprised of a material selected from the group consisting of oxide, silicon oxide ($SiO_2$) and a low-k material; the DARC layer is comprised of a material selected from the group consisting of nitride, silicon nitride (SiN), oxynitride, silicon oxynitride (SiON) and SiC; the first patterned masking layer is comprised of a material selected from the group consisting of photoresist, 193 nm photoresist, 157 nm photoresist and EUV photoresist; and the second patterned masking layer is comprised of photoresist.

27. The method of claim 13, wherein the low-k dielectric layer is comprised silicon oxide ($SiO_2$); the DARC layer is comprised of a material selected from the group consisting of nitride, silicon nitride (SiN), oxynitride, silicon oxynitride (SiON) and SiC; the first patterned masking layer is photoresist; and the second patterned masking layer is photoresist.

28. A method for etching dual damascene openings, comprising the steps of:
   providing a structure having an open area and a dense area; the structure having exposed metal structures formed therein within the open area and the dense area;
   forming an low-k dielectric layer over the structure and the exposed metal structures;
   forming a DARC layer over the low-k dielectric layer;
   forming a first patterned masking layer over the DARC layer; the first patterned masking layer having:
      via transfer openings exposing a portion of the DARC layer within the open area over at least a portion of the respective exposed metal structures within the open area; and
      via transfer openings exposing a portion of the DARC layer within the dense area over at least a portion of the respective exposed metal structures within the dense area;
   using the first patterned masking layer as a mask, etching the DARC layer and the low-k dielectric layer within the open area and the dense area, forming initial via openings exposing the respective exposed metal structures within the open area and the dense area;
   removing the first patterned masking layer;
   forming a second patterned masking layer over the etched DARC layer; the second patterned masking layer having:
      a wide trench transfer opening within the open area and over the initial via openings within the open area; and
      respective narrow trench transfer openings over the initial via openings within the dense area; and
   using the second patterned masking layer as a mask, further etching the DARC layer and the low-k dielectric layer employing an $CH_xF_y/O_2/N_2/Ar$ etch chemistry, having an etch depth micro-loading of less than about 4500 Å+/−250 Å, to form:
      a trench opening within the low-k dielectric layer within the open area; the open area trench opening having a bottom; the open area trench opening and the remaining open area initial via openings comprising an open area dual damascene opening; and
      trench openings within the low-k dielectric layer within the dense area; each dense area trench opening having a bottom; the dense area trench openings with their respective remaining dense area initial via openings comprising respective dense area dual damascene openings; the dense area trench openings being narrower than the open area trench opening;

the $CH_xF_y/O_2/N_2/Ar$ etch chemistry being employed at the following conditions:
   $CH_xF_y$ gas at from about 30 to 90 sccm;
   $O_2$ gas at from about 4 to 15 sccm;
   $N_2$ gas at from about 15 to 180 sccm;
   Ar gas at from about 100 to 500 sccm;
   a low electrode temperature of from about 0 to 60° C.; and
   a pressure of from about 50 to 150 mTorr;
wherein the $CH_xF_y/O_2/N_2/Ar$ etch chemistry has an etch selectivity of greater than about 2 and the open area trench opening bottom and the dense area trench opening bottoms are substantially coplanar.

29. The method of claim 28, wherein the $CH_xF_y/O_2/N_2/Ar$ etch chemistry has an etch selectivity of greater than about 2.5.

30. The method of claim 28, wherein $CH_xF_y$ is selected from the group consisting of $CH_3F$, $CH_2F_2$ and $CHF_3$.

31. The method of claim 28, wherein the low-k dielectric layer is formed to a thickness of from about 1200 to 10,000 Å; and the DARC layer is formed to a thickness of from about 300 to 1200 Å.

32. The method of claim 28, wherein the low-k dielectric layer is formed to a thickness of from about 5000 to 7500 Å; and the DARC layer is formed to a thickness of from about 500 to 700 Å.

33. The method of claim 28, wherein the open area trench opening is greater than about 20,000 Å wide and the dense area trench openings each have a width of less than about 5000 Å.

34. The method of claim 28, wherein the open area trench opening is greater than about 20,000 Å wide and the dense area trench openings each have a width of less than about 2000 Å.

35. The method of claim 28, wherein the low-k dielectric layer is comprised of a material selected from the group consisting of oxide, silicon oxide ($SiO_2$) and a low-k material; the DARC layer is comprised of a material selected from the group consisting. of nitride, silicon nitride (SiN), oxynitride, silicon oxynitride (SiON) and SiC; the first patterned masking layer is comprised of a material selected from the group consisting of photoresist, 193 nm photoresist, 157 nm photoresist and EUV photoresist; and the second patterned masking layer is comprised of photoresist.

36. The method of claim 28, wherein the low-k dielectric layer is comprised silicon oxide ($SiO_2$); the DARC layer is comprised of a material selected from the group consisting of nitride, silicon nitride (SiN), oxynitride, silicon oxynitride (SiON) and SiC; the first patterned masking layer is photoresist; and the second patterned masking layer is photoresist.

* * * * *